(12) United States Patent
Motoyama et al.

(10) Patent No.: US 11,848,264 B2
(45) Date of Patent: Dec. 19, 2023

(54) SEMICONDUCTOR STRUCTURE WITH STACKED VIAS HAVING DOME-SHAPED TIPS

(71) Applicant: INTERNATIONAL BUSINESS MACHINES CORPORATION, Armonk, NY (US)

(72) Inventors: Koichi Motoyama, Clifton Park, NY (US); Kenneth Chun Kuen Cheng, Shatin (HK); Chanro Park, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 242 days.

(21) Appl. No.: 17/303,600

(22) Filed: Jun. 3, 2021

(65) Prior Publication Data

US 2022/0392838 A1 Dec. 8, 2022

(51) Int. Cl.
| | | |
|---|---|---|
| *H01L 23/522* | (2006.01) | |
| *H01L 23/532* | (2006.01) | |
| *H01L 23/528* | (2006.01) | |
| *H01L 21/768* | (2006.01) | |

(52) U.S. Cl.
CPC ...... *H01L 23/5226* (2013.01); *H01L 21/7685* (2013.01); *H01L 21/76852* (2013.01); *H01L 21/76885* (2013.01); *H01L 21/76897* (2013.01); *H01L 23/5283* (2013.01); *H01L 23/53257* (2013.01); *H01L 23/53266* (2013.01)

(58) Field of Classification Search
CPC ............. H01L 23/5283; H01L 23/5386; H01L 21/76885; H01L 21/76892; H01L 21/76816; H01L 23/5226; H01L 23/53257; H01L 21/823475; H01L 21/823871; H01L 21/32129; H01L 21/76897; H01L 21/28562; H01L 21/76879; H01L 21/7685; H01L 21/76852; H01L 23/53266
See application file for complete search history.

(56) References Cited

U.S. PATENT DOCUMENTS

| | | | |
|---|---|---|---|
| 6,395,627 B1 * | 5/2002 | Hoshino | ........... H01L 21/76879 257/E21.174 |
| 8,299,625 B2 | 10/2012 | Ponoth | |
| 9,613,861 B2 | 4/2017 | Anderson | |
| 10,395,986 B1 | 8/2019 | Briggs | |
| 10,685,879 B1 * | 6/2020 | Arnold | .............. H01L 21/76897 |

(Continued)

FOREIGN PATENT DOCUMENTS

EP   3151272 A1 *  4/2017  ............. H01L 21/31

*Primary Examiner* — Younes Boulghassoul
(74) *Attorney, Agent, or Firm* — Yuanmin Cai

(57) ABSTRACT

A semiconductor structure may include a metal line, a via above and in electrical contact with the metal lines, and a dielectric layer positioned along a top surface of the metal lines. A top surface of the dielectric layer may be below the dome shaped tip of the via. A top portion of the via may include a dome shaped tip. The semiconductor structure may include a liner positioned along the top surface of the dielectric layer and a top surface of the dome shaped tip of the via. The liner may be made of tantalum nitride or titanium nitride. The dielectric layer may be made of a low-k material. The metal line and the via may be made of ruthenium. The metal line may be made of molybdenum.

5 Claims, 6 Drawing Sheets

(56) References Cited

U.S. PATENT DOCUMENTS

| | | | |
|---|---|---|---|
| 11,152,257 B2* | 10/2021 | Lanzillo | H01L 21/76849 |
| 2002/0155693 A1 | 10/2002 | Hong | |
| 2015/0056800 A1 | 2/2015 | Mebarki | |
| 2017/0263557 A1* | 9/2017 | Clevenger | H01L 23/53266 |
| 2018/0090439 A1 | 3/2018 | Liu | |
| 2019/0164887 A1* | 5/2019 | Wang | H01L 23/5283 |
| 2019/0237402 A1* | 8/2019 | Briggs | H01L 21/76847 |
| 2019/0311984 A1* | 10/2019 | Lin | H01L 21/76816 |
| 2020/0066585 A1* | 2/2020 | Lin | H01L 21/76883 |
| 2020/0098688 A1* | 3/2020 | Shi | H01L 21/28568 |
| 2020/0161175 A1 | 5/2020 | Yang | |
| 2020/0219808 A1* | 7/2020 | Hwang | H01L 21/76832 |
| 2021/0082803 A1* | 3/2021 | Wang | H01L 21/76879 |
| 2021/0167004 A1* | 6/2021 | Seo | H01L 23/5283 |
| 2021/0327756 A1* | 10/2021 | Xie | H01L 21/76805 |
| 2022/0165659 A1* | 5/2022 | Huang | H01L 23/53204 |
| 2022/0415710 A1* | 12/2022 | Reid | C25D 5/18 |
| 2023/0095976 A1* | 3/2023 | Liang | H01L 21/76802 |
| | | | 257/751 |

* cited by examiner

SEMICONDUCTOR STRUCTURE WITH STACKED VIAS HAVING DOME-SHAPED TIPS

BACKGROUND

The present invention relates generally to semiconductors, and more particularly, to a semiconductor structure with a top via interconnect having an enlarged via top profile.

Semiconductor devices are used in many electronic and other applications and include integrated circuits that are formed on semiconductor wafers. The manufacturing of semiconductor devices is typically classified into two phases, the front end of line (FEOL) and the back end of line (BEOL). The BEOL is typically considered to be the point of the manufacturing process where metallization layers, or interconnects, are formed, and FEOL is considered to include the manufacturing processes prior to the formation of metallization layers, and where active devices are formed.

SUMMARY

According to one embodiment of the present invention, a structure is provided. The structure may include a metal line, a via above and in electrical contact with the metal lines, and a dielectric layer positioned along a top surface of the metal lines. A top surface of the dielectric layer may be below the dome shaped tip of the via. A top portion of the via may include a dome shaped tip. The semiconductor structure may include a liner positioned along the top surface of the dielectric layer and a top surface of the dome shaped tip of the via. The liner may be made of tantalum nitride or titanium nitride. The dielectric layer may be made of a low-k material. The metal line and the via may be made of ruthenium. The metal line may be made of molybdenum.

According to another embodiment of the present invention, a structure is provided. The structure may include a first metal line, a first via above and in electrical contact with the first metal line, a first dielectric layer positioned along a top surface of the first metal line, a first liner positioned along the top surface of the first dielectric layer and a top surface of the dome shaped tip of the first via, and a second via above and in electrical contact with a second metal line. A top portion of the first via may include a dome shaped tip. A top portion of the second via may include the dome shaped tip. A top surface of the first dielectric layer may be below the dome shaped tip of the first via. The semiconductor structure may include a second dielectric layer positioned along a top surface of the second metal line, and a second liner positioned along the top surface of the second dielectric layer and a top surface of the dome shaped tip of the second via. A top surface of the second dielectric layer may be below the dome shaped tip of the second via. The first and second dielectric layers may be made of a low-k material. The first and second metal lines and the first and second vias may be made of ruthenium. The first and second metal lines and the first and second vias may be made of molybdenum.

According to another exemplary embodiment of the present invention, a method is provided. The method may include forming a semiconductor structure comprising a via above a metal line, depositing a dielectric layer along a top surface of the metal line, and depositing metal along the top surface of the via to form a dome shaped tip. A top surface of the dielectric layer may be below a top surface of the via. The method may include depositing a liner along the top surface of the dielectric layer and a top surface of the dome shaped tip of the via. The dielectric layer may be made of a low-k material. The metal line and the via may be made of ruthenium. The metal line and the via may be made of molybdenum.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
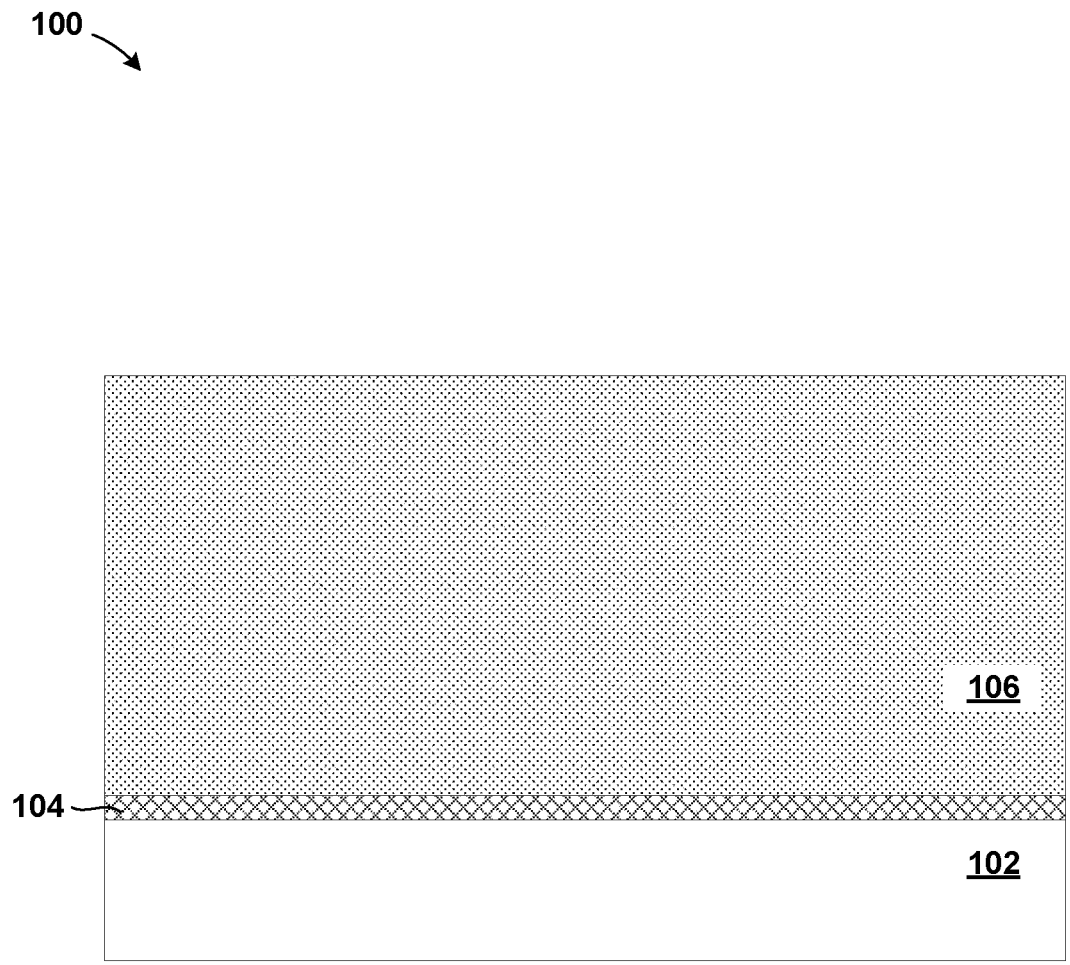
FIG. 1 is a cross section view illustrating the formation of a metal layer and a liner on a substrate according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Forming high quality interconnects is a critical part of large-scale integration in integrated circuits. Some integrated circuits may have a single top layer of metallization and other integrated circuits may include multi-level interconnects, where two or more metallization layers are formed over a semiconductor wafer or workpiece. Each metallization layer may include a plurality of metal lines separated from one another by an insulating material. The metal lines in immediately neighboring horizontal metallization layers may be connected vertically in predetermined places by vias formed between the metal lines.

For BEOL, the overall performance of interconnects is dependent on resistance and capacitance. The resistance may include the resistance of the metal lines and the vias, and the capacitance may include the capacitance between the metal lines. In large-scale integration, when transistor density may be improved, the overall performance of interconnects may decline due to increased resistance of the metal lines and the vias and the increased capacitance between the metal lines. For example, for BEOL metal pitch below 30 nm, the resistive-capacitive delay, or R/C delay, may grow unsustainably large, thus hindering the overall performance of a transistor device. This may be due to the fact that conventional methods of manufacture produce vias whose top portions are narrower than their respective bottom portions. That is, the via's top portion has a critical dimension that is smaller than the critical dimension of the via's bottom portion. As a result, the via's resistance increases because it is the via's top portion that is in contact with the metal line above it. Therefore, since the via's top portion has a smaller critical dimension that its respective bottom portion, the via's top portion has a smaller contact area with the metal line above it.

Embodiments of the present invention provide a solution to the problem of increased resistance and capacitance in the metal lines and vias when fabricated using conventional methods of fabrication. More particularly, embodiments of the present invention relate to a semiconductor structure with a top via interconnect having an enlarged via top profile. That is, a metal such as ruthenium or molybdenum is used, in conjunction with a subtractive etch process, to form the metal line and via. In addition, further processing of the via enlarges its top profile, thus increasing the contact area of the via with the metal line above it. As a result of the increased contact area, the resistance of the via is reduced.

FIGS. 1-7 illustrate a method of making the semiconductor structure with a top via interconnect having an enlarged via top profile.

Referring now to FIG. 1, a structure 100 is shown, in accordance with an embodiment. The structure 100 may include a substrate 102, a first liner 104, and a first metal layer 106. The substrate 102 may include one or more semiconductor materials. Non-limiting examples of suitable substrate 102 materials may include Si (silicon), strained Si, Ge (germanium), SiGe (silicon germanium), Si alloys, Ge alloys, III-V materials (e.g., GaAs (gallium arsenide), InAs (indium arsenide), InP (indium phosphide), or Indium Gallium Arsenide (InGaAs), II-VI materials (e.g., CdSe (cadmium selenide), CdS (cadmium sulfide), CdTe (cadmium telluride)), or any combination thereof. In an embodiment, the substrate 102 may include silicon.

The first liner 104 is deposited on top of the substrate 102 using know deposition techniques such as, for example, atomic layer deposition (ALD), physical vapor deposition (PVD), chemical vapor deposition (CVD), plasma enhanced chemical vapor deposition (PECVD), or any combination thereof. The first liner 104 may be made of any material that may prevent electromigration such as, for example, tantalum nitride or titanium nitride. The first liner 104 may act as an adhesion layer that enhances the adhesion of the first metal layer 106 during the deposition of the first metal layer 106.

The first metal layer 106 is deposited on top of the first liner 104 using known deposition techniques such as, ALD. The first metal layer 106 may be deposited to a thickness that allows for subsequent formation of a metal line and a via within the first metal layer 106. The first metal layer 106 may be made of metal such as ruthenium, molybdenum, or any other metal that may be processed using a subtractive etch process.

Figure 2:
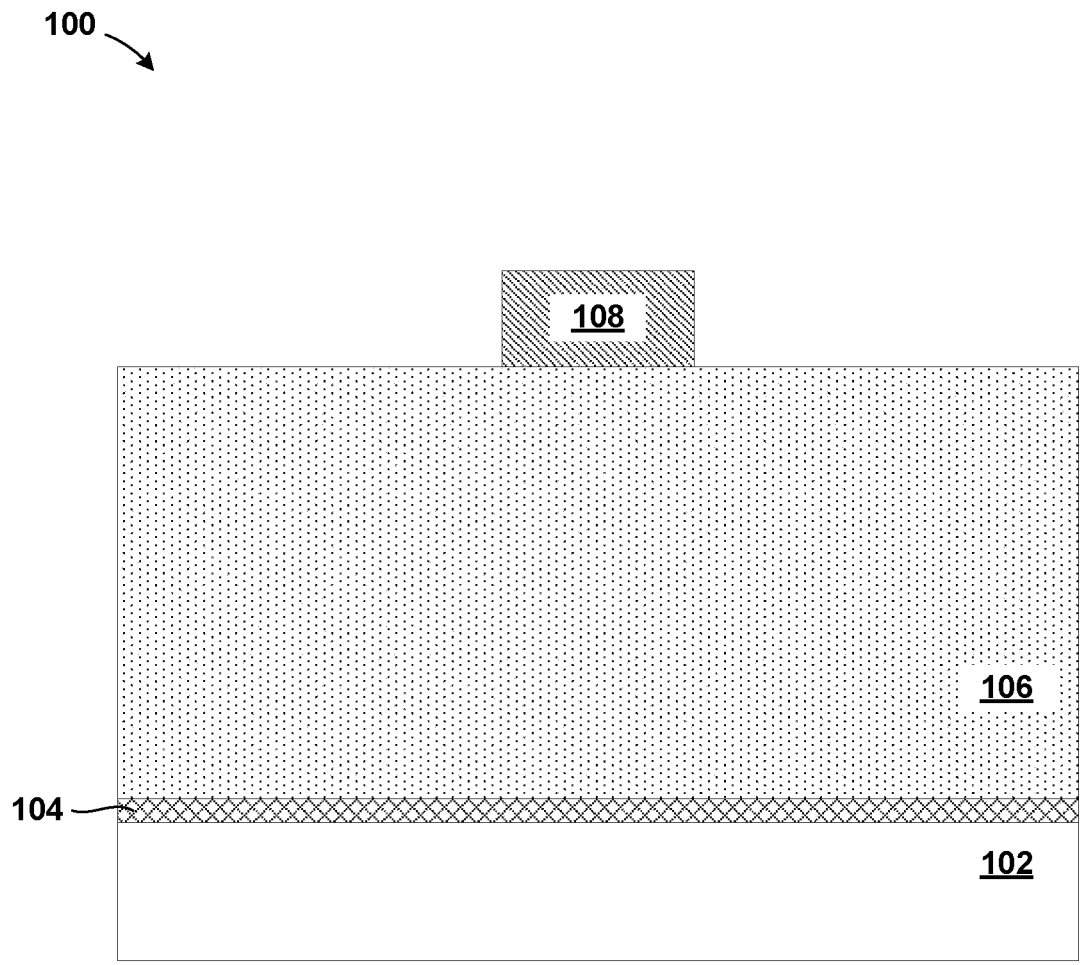
FIG. 2 is a cross section view illustrating a hard mask cap on top of the metal layer according to an exemplary embodiment.

Referring now to FIG. 2, the structure 100 with a hard mask cap 108 is shown, in accordance with an embodiment. A hard mask (not shown) is first deposited on top of the first metal layer 106 using know deposition techniques such as, ALD. The hard mask may be made of tetraethyl orthosilicate (TEOS). The hard mask is then patterned to form the hard mask cap 108. The hard mask cap 108 protects the portion of the first metal layer 106 directly below the hard mask cap 108 during subsequent process of manufacture.

Figure 3:
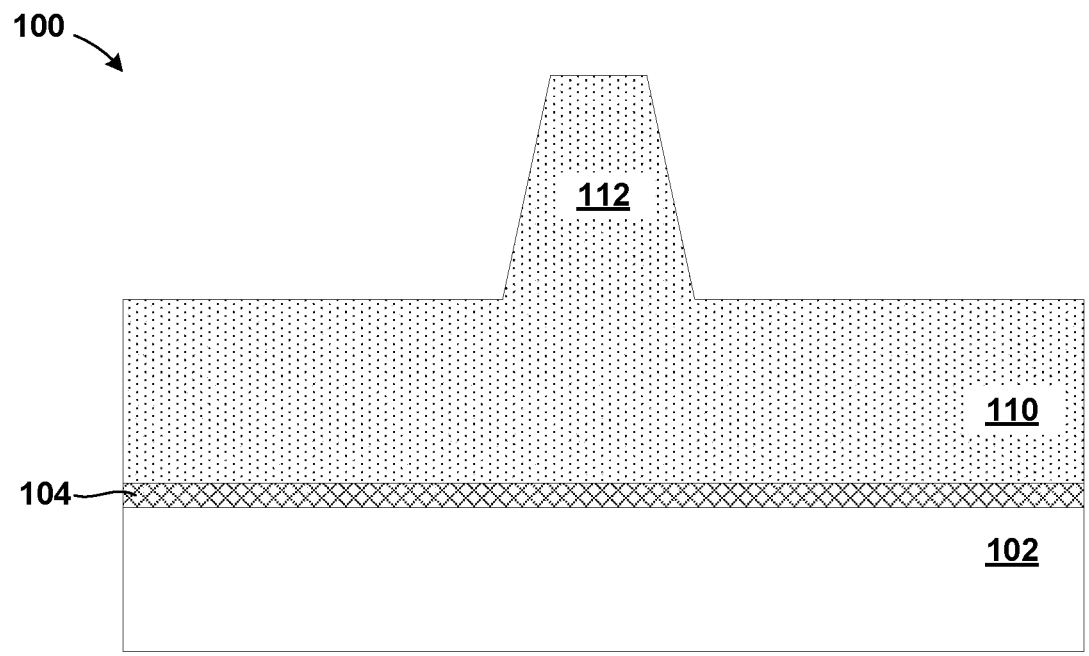
FIG. 3 is a cross section view illustrating the formation of a metal line and a via according to an exemplary embodiment.

Referring now to FIG. 3, the structure 100 with a first metal line 110 and a first via 112 is shown, in accordance with an embodiment. Once the hard mask cap 108 is patterned, the structure 100 undergoes a dry etch process such as, a reactive ion etch (RIE) process, to form the first metal line 110 and the first via 112. The first via 112 is formed on top of the first metal line 110 and is in electrical contact with the first metal line 110. The first via 112 has a trapezoid shape and includes a top portion whose critical diameter is smaller when compared to the critical diameter of its bottom portion. That is, the dry etch process forms the first via 112 such that the top portion of the first via 112 is narrower than the bottom portion of the first via 112. Once the first metal line 110 and the first via 112 are formed, the hard mask cap 108 (illustrated in FIG. 2) is removed using conventional stripants such as oxygen ashing techniques.

Figure 4:
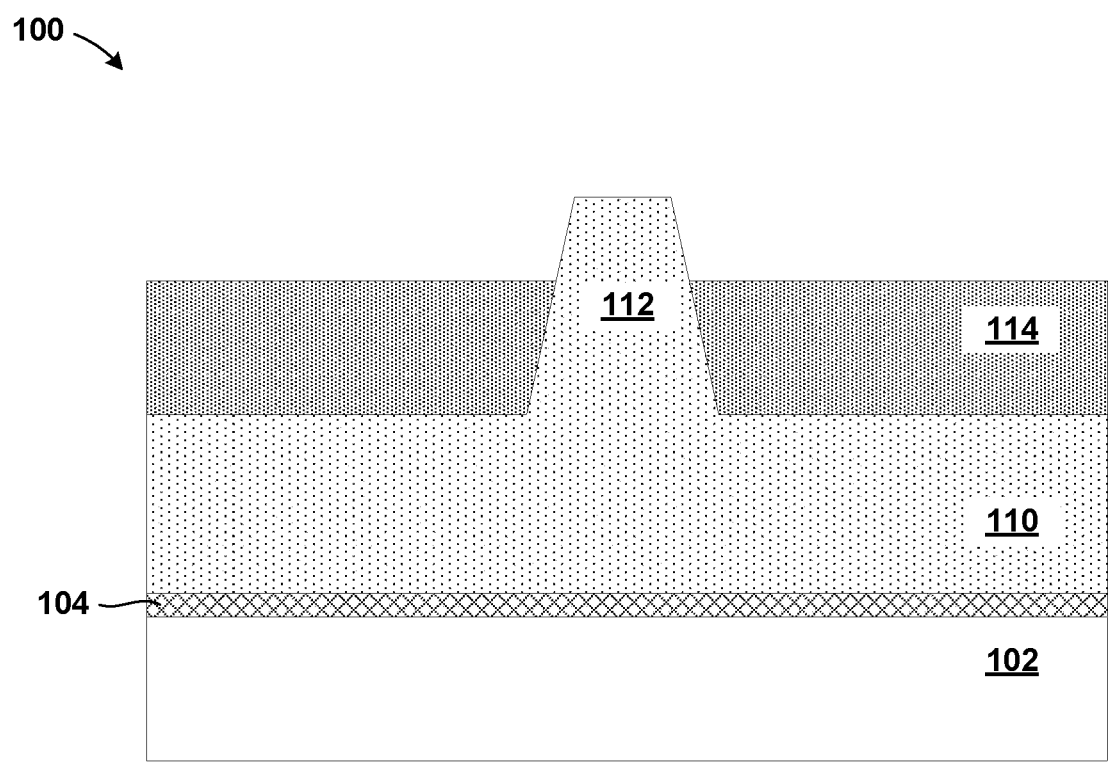
FIG. 4 is a cross section view illustrating the formation of a dielectric layer on top of the metal line according to an exemplary embodiment.

Referring now to FIG. 4, the structure 100 with a first dielectric layer 114 is shown, in accordance with an embodiment. The first dielectric layer 114 may be made of flowable low-k dielectric material (with k<4.0), including but not limited to, silicon oxide, spin-on-glass, a flowable oxide, a high density plasma oxide, borophosphosilicate glass (BPSG), or any combination thereof. The first dielectric layer 114 is deposited on top of the structure 100 using a flowable chemical vapor deposition process.

During conventional manufacturing, the first dielectric layer 114 is deposited on top of the structure 100 such that it covers the top surface of the first via 112. A low-k chemical mechanical polishing (CMP) is then performed to remove the excess first dielectric layer 114 in order to expose the top surface of first the via 112. However, the low-k CMP is hard to control and often times may damage the first via 112 leading to connectivity issues that may arise between the first via 112 and a metal line above it. Embodiments of the present invention do not require the use of the low-k CMP to remove excess first dielectric layer 114. Rather, in an embodiment, the first dielectric layer 114 is deposited on the top surface of the first metal line 110 using a flowable chemical vapor deposition process that is timed. As a result, the deposition process may be stopped before the top surface of the first dielectric layer 114 reaches the top surface of the first via 112. Therefore, the first dielectric layer 114 is deposited such that it covers the top surface of the first metal line 110 and bottom portion of the first via 112. As a result, the top surface of the first dielectric layer 114 is below the top surface of the first via 112. That is, the top narrow portion of the first via 112 is exposed while the wider bottom portion of the first via 112 is covered by the first dielectric layer 114.

In an alternative embodiment, the first dielectric layer 114 is deposited on top of the structure 100 such that the first dielectric layer 114 covers the top surface of the first via 112. In order to expose the top narrow portion of the first via 112, an etch process such as, a RIE process, may be used to remove the excess first dielectric layer 114. Using an etch process to remove portions of the first dielectric layer 114 and expose the top narrow portion of the first via 112 does not damage the first via 112 as the low-k CMP process does. As a result, the electrical integrity of the first via 112 is maintained. In both embodiments, the first dielectric layer 114 is used to cover the top surface of the structure 100 except the top narrow portion of the first via 112.

Figure 5:
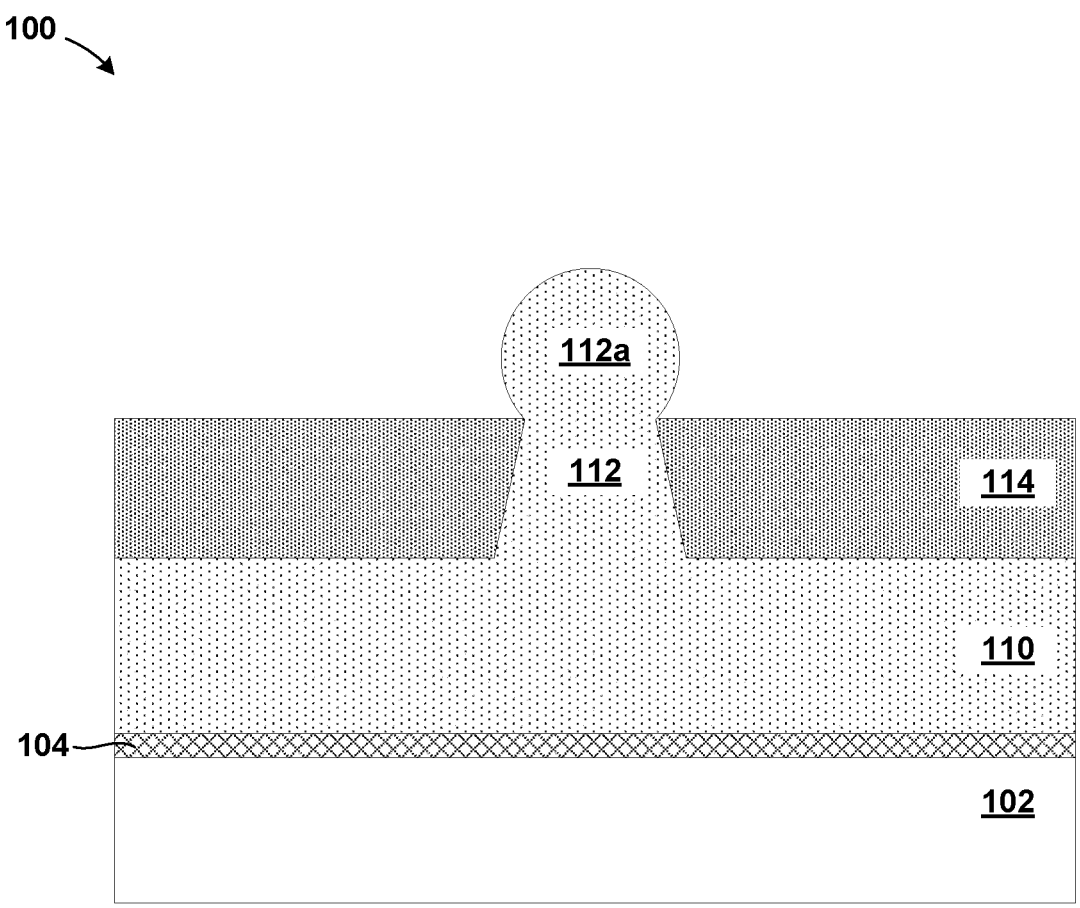
FIG. 5 is a cross section view illustrating the via with an enlarged dome shaped top portion according to another exemplary embodiment.

Referring now to FIG. 5, the structure 100 with an enlarged top portion of the first via 112 is shown, in accordance with an embodiment. A selective deposition process such as CVD may be used to selectively deposit metal on the exposed top narrow portion of the first via 112. The metal that may be deposited is dependent on the type of metal that is used to form the first metal line 110 and the first via 112. For example, if ruthenium is used to form the first metal line 110 and the first via 112, then ruthenium is deposited on the exposed top narrow portion of the first via 112. However, if molybdenum, or any other metal, is used to form the first metal line 110 and the first via 112, then that corresponding metal is then deposited on the exposed top narrow portion of the first via 112.

The additional deposition of the metal enlarges the top portion of the first via 112 only. This is due to the fact that the rest of the structure 100 is protected by the first dielectric layer 114. During conventional manufacturing, the structure 100 is not protected by the first dielectric layer 114. Rather, a mask is used to cover the top portions of the structure 100 so that the metal may only be deposited on top of the via. However, embodiments of the present invention use the first dielectric layer 114 to cover and protect other parts of the structure 100 and leave the top portion of the first via 112 exposed. The low-k properties of the first dielectric layer 114 prevents metal from adhering to it. As a result, the additional deposition of the metal does not have an effect on the surface of the first dielectric layer 114. Rather, the metal concentrates around the exposed top narrow portion of the first via 112, enlarging the first via's 112 top profile, or portion, into a dome shaped tip 112a. Therefore, the top surface of the first dielectric layer 114 is below the dome shaped tip 112a of the first via 112.

Enlarging the first via's 112 top profile into the dome shaped tip 112a increases the first via's 112 top surface area, thus increasing the contact area between the top surface of the via 112 and the metal line above it. As a result of the increased contact area (the top surface of the dome shaped tip 112a), the resistance in the first via 112 is reduced. This in turn reduces the overall resistance of the first metal line 110 and a subsequent metal line above the first via 112 giving a better overall performance of the transistor device.

Figure 6:
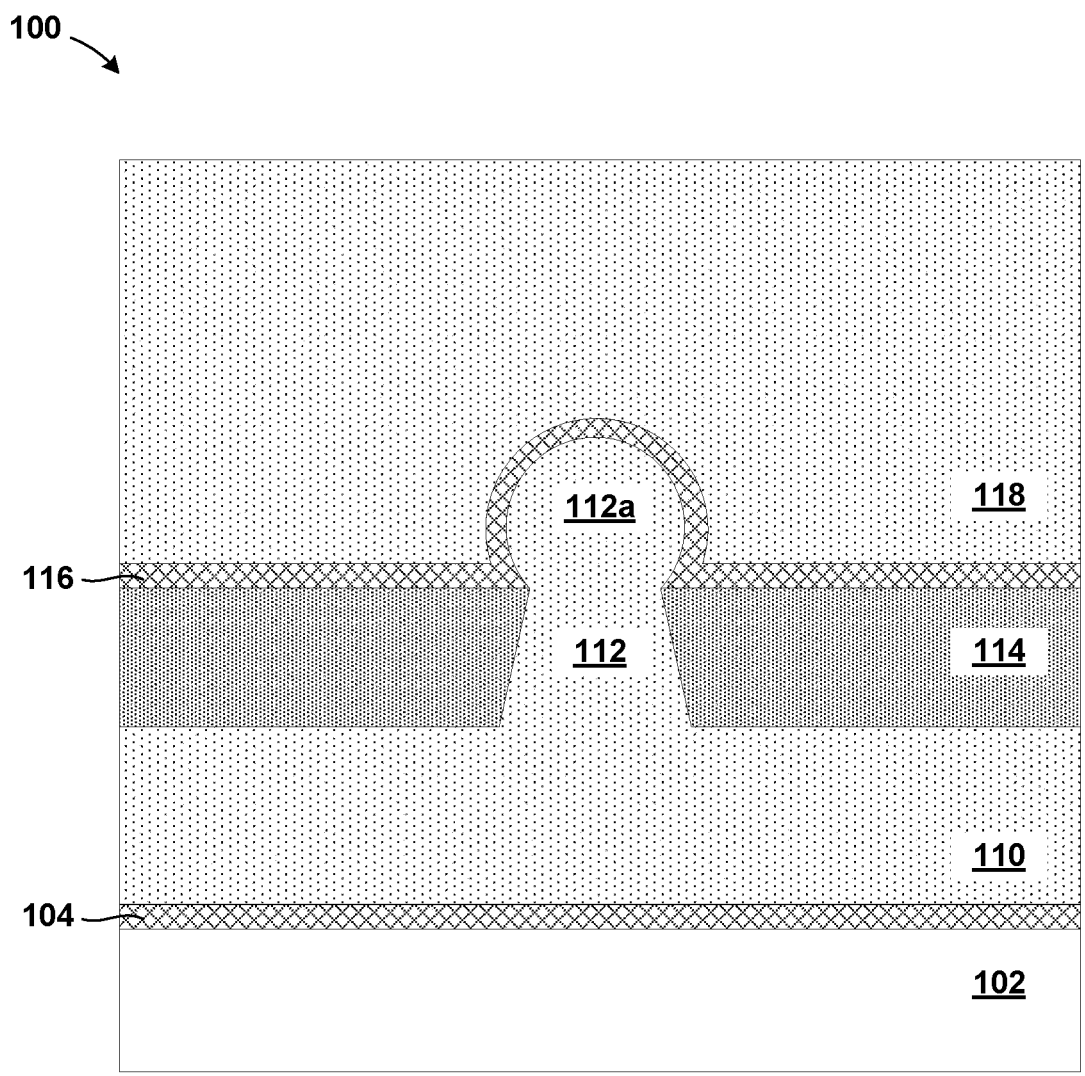
FIG. 6 is a cross section view illustrating the formation of a second liner and a second metal layer according to an exemplary embodiment.

Referring now to FIG. 6, the structure 100 with a second liner 116 and a second metal layer 118 is shown, in accordance with an embodiment. The second liner 116 is deposited on top of the structure 100, covering the top surface of the first dielectric layer 114 and the top surface of the dome shaped tip 112a of the first via 112. The second liner 116 may be made of substantially the same materials as the first liner 104. The second liner 116 may be deposited using known deposition techniques such as, for example, ALD, PVD, CVD, or PECVD.

The second metal layer 118 is deposited on top of the second liner 116 using known deposition techniques such as, ALD. The second metal layer 118 may be made of substantially the same material as the first metal layer 106. For example, the second metal layer 118 may be made of ruthenium or molybdenum. Just like the first metal layer 106, the second metal layer 118 is deposited to a thickness that may allow for subsequent formation of a metal liner and a via.

Figure 7:
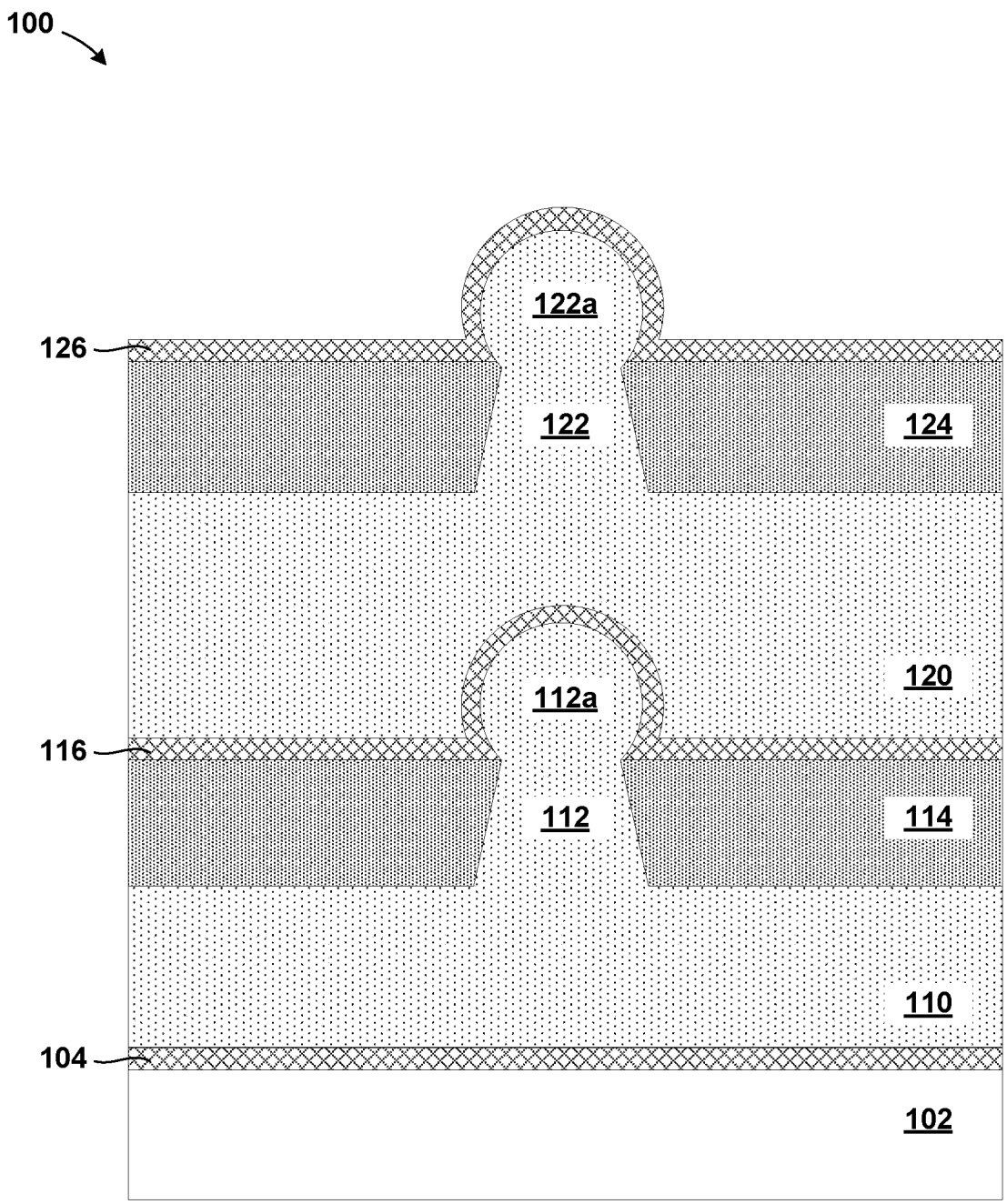
FIG. 7 is a cross section view illustrating the formation of a second metal line and a second via with an enlarged dome shaped top portion according to another exemplary embodiment.

Referring now to FIG. 7, the structure 100 with a second metal line 120 and a second via 122 is shown, in accordance with an embodiment. A hard mask (not shown) is first deposited on top of the second metal layer 118 using know deposition techniques such as, ALD. The hard mask may be made of tetraethyl orthosilicate (TEOS). The hard mask is then patterned and a dry etch process such as, for example, a ME process is used to form the second metal line 120 and the second via 122. The second via 122 is formed on top of the second metal line 120 and is in electrical contact with the second metal line 120. The second via 122 may have the same trapezoid shape as the via 112. The second via 122 may include a top portion whose critical diameter is smaller when compared to the critical diameter of its bottom portion.

The structure 100 undergoes further processing where a second dielectric layer 124 is deposited on top of the structure 100. The second dielectric layer 124 is deposited using a flowable chemical vapor deposition process and may be made of substantially the same material as the dielectric layer 114. The second dielectric layer 124 may be deposited to the same thickness as the dielectric layer 114. As a result, the second dielectric layer 124 is deposited such that it covers the top surface of the second metal line 120 and a bottom portion of the second via 122. The top surface of the second dielectric layer 124 is below the top surface of the second via 122. The second dielectric layer 124 protects the structure 100 during the subsequent deposition of metal on top of the exposed top portion of the second via 122.

After the second dielectric layer 124 is deposited, using a selective deposition process such as CVD a metal is selectively deposited on the exposed top narrow portion of the second via 122. The metal that may be deposited is dependent on the type of metal that is used to form the second metal line 120 and the second via 122. For example, if ruthenium is used to form the second metal line 120 and the second via 122, then ruthenium is deposited on the exposed top narrow portion of the second via 122. However, if molybdenum, or any other metal, is used to form the second metal line 120 and the second via 122, then that corresponding metal is then deposited on the exposed top narrow portion of the second via 122.

The additional deposition of the metal enlarges only the top portion of the second via 122 because the rest of the structure 100 is covered by the second dielectric layer 124.

As a result, the additional deposition of the metal does not have an effect on the surface of the second dielectric layer 124. Rather, the metal concentrates around the exposed top narrow portion of the second via 122, enlarging the second via's 122 top profile into a dome shaped tip 122*a*. Enlarging the second via's 122 top profile into the dome shaped tip 122*a* increases the second via's 122 top surface area, thus increasing the contact area between the top surface of the second via 122 and the metal line above it. As a result of the increased contact area (the top surface of the dome shaped tip 132*a*), the resistance in the second via 122 is reduced. This in turn reduces the overall resistance of the second metal line 120 which gives a better overall performance of the transistor device.

The structure 100 may undergo additional processing during which a third liner 126 is deposited on top of the second dielectric layer 124 and a top surface of the dome shaped tip 122*a* of the second via's 122 top profile. The third liner 126 may be made of substantially the same materials as the first and second liners 104, 116. The third liner 126 may be deposited using know deposition techniques such as ALD. The structure 100 may then be further processed to form another metal line and via.

The resultant structure 100, illustrated in FIG. 7, includes the first and second metal lines 110, 120 and the first and second vias 112, 122. The first via 112 is separated from the second metal line 120 by a second liner 116. Both the first via 112 and the second via 122 include top portions that have dome shaped tips 112*a*, 122*a*, respectively. The dome shaped tips 112*a*, 122*a* increase the top profiles of the first and second vias 112, 122. The increased top profiles increase the surface areas of the top portions of the first and second vias 112, 122. As a result, the contact areas between the vias and the metal lines on top of the vias increase. This results in a decreased resistance in the first via 112 and the second via 122. This in turn reduces the overall resistance of the metal lines on top of the vias 112, 122 as well as the first and second metal lines 110, 120 giving a better overall performance of the transistor device.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   a first metal line;
   a first via above and in electrical contact with the first metal line, wherein a top portion of the first via includes a first dome shaped tip;
   a first dielectric layer positioned along a top surface of the first metal line, wherein a top surface of the first dielectric layer is below the first dome shaped tip of the first via;
   a first liner positioned along the top surface of the first dielectric layer and a top surface of the first dome shaped tip of the first via; and
   a second via above and in electrical contact with a second metal line, wherein a top portion of the second via includes a second dome shaped tip,
   wherein the second metal line is on top of and in direct contact with the first liner; wherein the first dome shaped tip of the first via has an enlarged width that is wider than a bottom of the first dome shaped tip; and wherein a bottom of the first via is wider than the bottom of the first dome shaped tip.

2. The semiconductor structure of claim 1, further comprising:
   a second dielectric layer positioned along a top surface of the second metal line, wherein a top surface of the second dielectric layer is below the second dome shaped tip of the second via; and
   a second liner positioned along the top surface of the second dielectric layer and a top surface of the second dome shaped tip of the second via.

3. The semiconductor structure of claim 2, wherein the first and second dielectric layers are made of a low-k material.

4. The semiconductor structure of claim 1, wherein the first and second metal lines and the first and second vias are made of ruthenium.

5. The semiconductor structure of claim 1, wherein the first and second metal lines and the first and second vias are made of molybdenum.

* * * * *